(12) United States Patent
Orchard-Webb

(10) Patent No.: US 6,323,599 B1
(45) Date of Patent: Nov. 27, 2001

(54) VERTICAL SPARK GAP FOR MICROELECTRIC CIRCUITS

(75) Inventor: Jonathan Harry Orchard-Webb, Gwent (GB)

(73) Assignee: Mitel Corporation, Kanata (CA)

( * ) Notice: Subject to any disclaimer, the term of this patent is extended or adjusted under 35 U.S.C. 154(b) by 0 days.

(21) Appl. No.: 09/246,838

(22) Filed: Feb. 9, 1999

(30) Foreign Application Priority Data

Feb. 21, 1998 (GB) .................................................. 9803585

(51) Int. Cl.$^7$ .................................................. H05B 21/70
(52) U.S. Cl. .................... 315/209 M; 438/619; 438/639; 313/325; 257/522
(58) Field of Search .................... 438/619, 639; 313/634, 631, 632, 622, 325; 315/209 M, 71, 58; 257/522; 29/852

(56) References Cited

U.S. PATENT DOCUMENTS

| | | | |
|---|---|---|---|
| 4,504,766 | 3/1985 | Kaneko | 313/634 |
| 5,357,397 * | 10/1994 | Leary | 361/220 |
| 5,436,183 * | 7/1995 | Davis et al. | 437/40 |
| 5,656,530 | 8/1997 | Leary | 438/639 |
| 5,786,613 * | 7/1998 | Kalnisky | 257/355 |
| 5,796,570 * | 8/1998 | Mekdhanasarn et al. | 361/126 |
| 5,811,330 * | 9/1998 | Kalnitsky | 438/238 |
| 5,891,354 * | 4/1999 | Lee et al. | 216/99 |
| 5,915,757 * | 6/1999 | Tsuyama et al. | 29/852 |
| 5,990,519 * | 11/1999 | Huang-Lu et al. | 257/357 |
| 6,002,569 * | 12/1999 | Horvath | 361/111 |

* cited by examiner

Primary Examiner—Don Wong
Assistant Examiner—Tuyet T. Vo
(74) Attorney, Agent, or Firm—Lawrence E. Laubscher, Jr.

(57) ABSTRACT

A vertical spark gap assembly for electronic circuits employing poly silicon. The assembly permits dissipation of higher voltages in spark discharge without shorting in the circuit. The spark gap assembly includes a first partially conductive layer and a second partially conductive layer and a non-conductive material positioned between the layers and maintaining a vertically spaced apart relationship therebetween. At least one opening is provided in the first layer and the second layer with the non-conductive material removed from the layer having at least one opening. As such, the arrangement provides a vertical gap formed between and communicating with each layer.

12 Claims, 6 Drawing Sheets

US 6,323,599 B1

VERTICAL SPARK GAP FOR MICROELECTRIC CIRCUITS

FIELD OF THE INVENTION

The present invention is directed to an arrangement to alleviate the deleterious effects of electrostatic discharges in electronic circuits and more particularly, the present invention is directed to a vertical spark gap suitable for use in microelectronic circuits.

BACKGROUND OF THE INVENTION

Spark gaps have been proposed earlier in the art with the objective of counteracting electrostatic discharges on integrated circuits. Previous arrangements employed aluminum, however, due to the physical properties of the metal and especially its low melting point resulted in mass transport through and across the oxides and dielectrics and this was found to be problematic thus making aluminum an impractical choice.

Another limitation encountered in this field relates to the control of the breakdown voltage. Spark gaps are typically lateral and formed by photoengraving techniques. This process makes tolerances difficult to control leading to problems in forming short spark gaps.

Finally, limitations in successful operation of spark gaps in plastic packages are realized since the air in the gap is displaced by the plastic.

SUMMARY OF THE INVENTION

One object of one embodiment of the present invention is to provide a spark gap assembly suitable for use in electronic circuits, comprising:

a first at least partially conductive layer;

a second at least partially conductive layer;

nonconductive material positioned between the first layer and the second layer maintaining a vertically spaced relationship therebetween;

at least one opening in at least one of the first layer and the second layer, the nonconductive material removed from the layer having the at least one opening, whereby a vertical gap is formed between and communicates with each layer.

A further object of one embodiment of the present invention is to provide a spark gap assembly, comprising:

a first at least partially conductive layer;

a second at least partially conductive layer;

nonconductive material positioned between the first layer and the second layer maintaining a vertically spaced relationship therebetween, each layer in an overlying relationship with the material; and, at least one opening in at least one of the first layer and the second layer, the nonconductive material removed from the layer having the at least one opening, the opening comprising a vertical spark gap for dissipating electrostatic charge.

As a further object of one embodiment of the present invention, there is provided a method of forming a vertical spark gap suitable for use in dissipating electrostatic buildup in an integrated circuit, comprising:

providing a first at least partially conductive layer and a second at least partially conductive layer;

positioning nonconductive material between the first layer and the second layer maintaining a vertically spaced relationship therebetween; and forming at least one opening in one of the first or the second layer by etching insulating material associated with the first layer and the second layer to form a vertical gap therebetween.

Having thus described the invention, reference will now be made to the accompanying drawings illustrating preferred embodiments.

BRIEF DESCRIPTION OF THE DRAWINGS

FIG. 2b is an end elevation view of FIG. 2a;

FIG. 3b is a side view of FIG. 3a;

FIG. 4b is a cross-section of FIG. 4a;

FIG. 6b is a cross-section of FIG. 6a;

Similar numerals employed in the text denote similar elements.

DETAILED DESCRIPTION OF THE PREFERRED EMBODIMENTS

Figure 1:
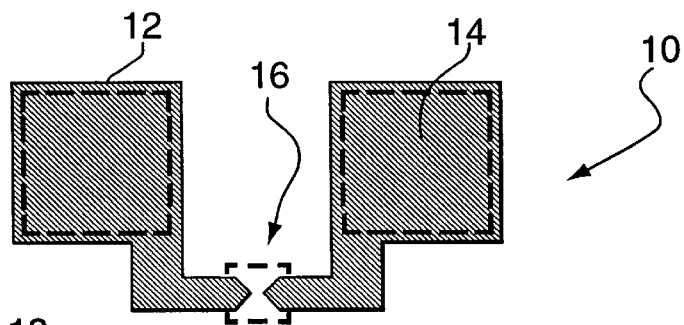
FIG. 1 is a plan view of a spark gap arrangement of the prior art.

Referring now to the drawings, FIG. 1 illustrates a typical lateral spark gap assembly, globally denoted by numeral 10 in which strips of metal 12 and 14 are placed in close proximity and suitable for connection to nodal points in a circuit (not shown) to be protected by the gap. The gap is generally designated by numeral 16.

Figure 2A:
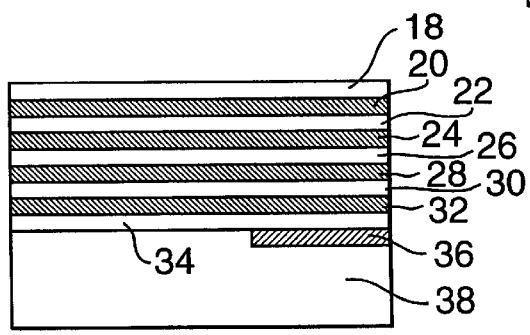
FIG. 2a is a cross-section of an integrated circuit.
Figure 2B:
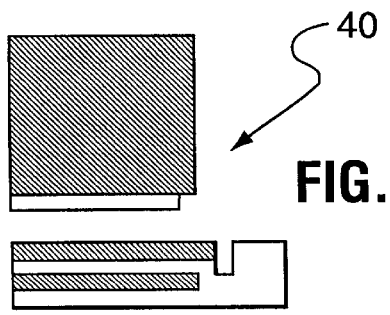

FIG. 2a illustrates a cross-section of a typical integrated circuit having a passivation layer 18, a metal layer 20, dielectric layer 22, a first level metal layer 24, a pyroglass layer 26, a second level poly silicon layer 28, a capacitor oxide layer 30, a first level poly silicon layer 32, a thermal oxide layer 34, a diffusion layer 36 and a substrate layer 38. With reference to FIG. 2b, implementation of a vertical spark gap involves a lateral component broadly denoted by numeral 40 and this introduces alignment errors.

Figure 3A:
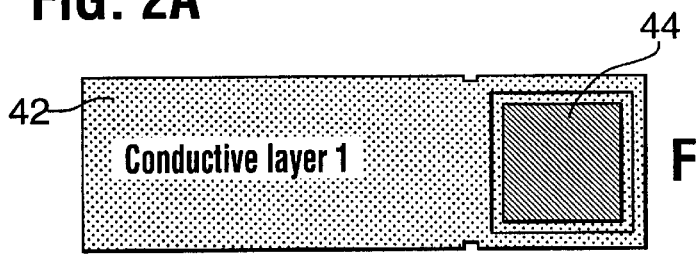
FIG. 3a is a plan view of a first embodiment of the present invention.
Figure 3B:
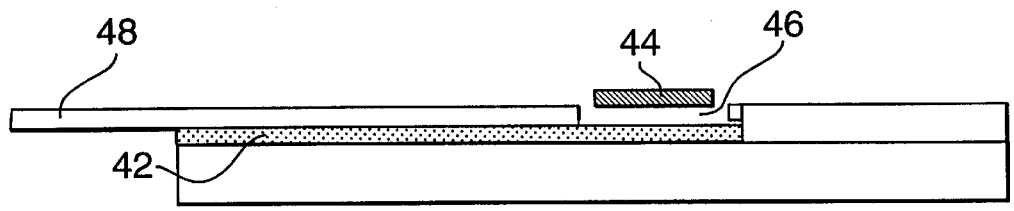

This problem has been alleviated by the invention and with reference now to FIG. 3a, shown is a conductor in a first layer 42 which surrounds and overlies the second conductor 44. This vertical arrangement avoids the alignment problem set forth with respect to FIG. 2b. FIG. 3b illustrates the arrangement in FIG. 3a in cross-section for greater detail and illustrates the vertical spark gap 46 formed between conductive layer 42 and conductive layer 44. In each case, the conductive layers 42 and 44 have an insulating material 48 positioned therebetween and by etching (to be discussed in greater detail hereinafter), the insulator material around the opening between the two layers can be removed to create an open gap between the two layers 42 and 44.

Figure 4A:
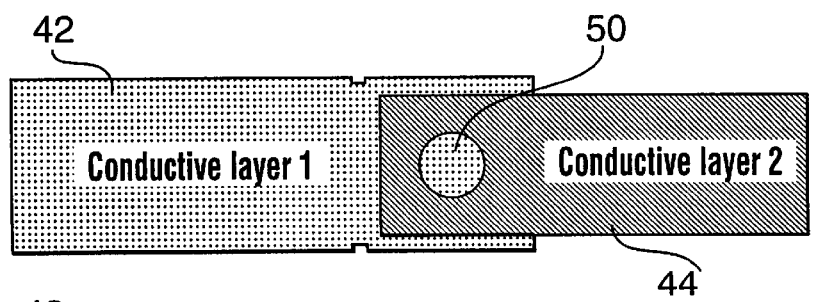
FIG. 4a is a plan view of a second embodiment of the present invention.
Figure 4B:
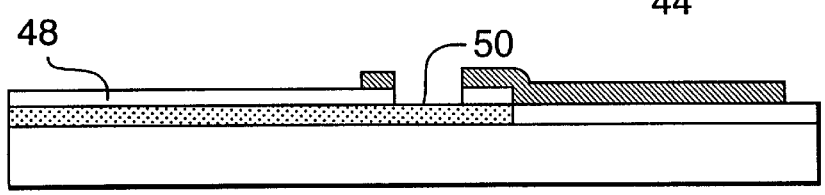

FIG. 4a illustrates a further embodiment of the invention in which conductive layer 44 includes an opening 50. The insulator material 48 is removed about hole 50 thus providing the vertical air gap shown more clearly in the cross-section of FIG. 4b. In this manner, the air gap 50 is formed between the underside of the hole 50 and the lower plate and conductive layer 44. It will be apparent to those skilled that this arrangement could easily be reversed. This structure provides a vertical spark gap with advantage of providing a well controlled, and if required, extremely small air gap which may be of the order of nanometers. The thickness of the insulating layer 48 can be used to set the spark gap voltage depending upon the intended use for the spark gap. The opening 50 is used to expose the underlying insulator to a process for removing the insulator from the region of the hole 50 to form an air gap between the two conductors 42 and 44. Suitable methods such as etching or other known procedures can be employed to effect this result. The opening 50 can also serve to exclude packaging material from the gap if it is made narrow enough (<1 $\mu$m).

Figure 5:
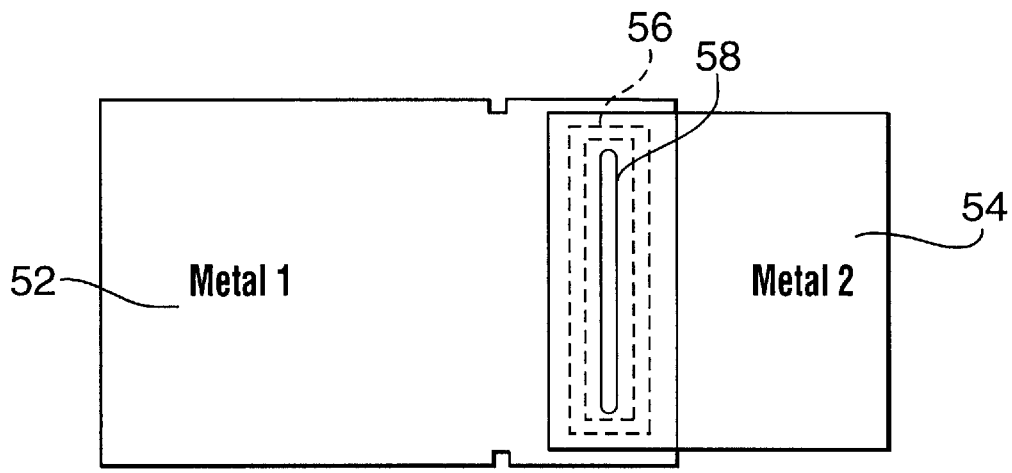
FIG. 5 is a plan view of a further embodiment of the present invention.

As an alternative, as illustrated in FIG. 5, in the context of an integrated circuit (not shown), the bottom plate could be a first level of metal 52 separated from a second layer of metal 54 by dielectric 56 shown in chain line. Double dielectrics will be readily apparent to those skilled in the art. In this arrangement, the spark gap or opening, represented by numeral 58, is in the form of a narrow slot.

Figure 6A:
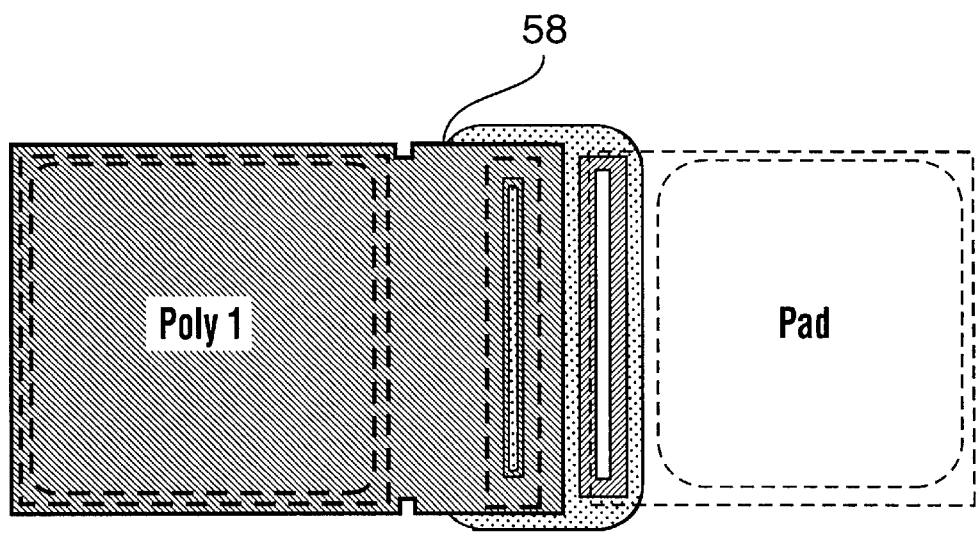
FIG. 6a is a top plan view of a further embodiment of the present invention.
Figure 6B:
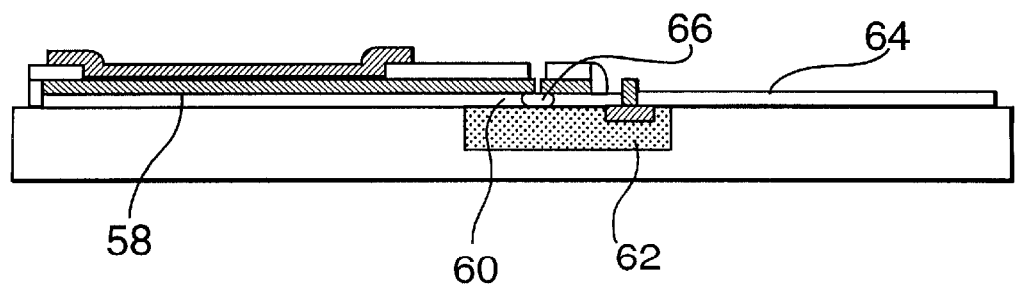
Figure 7A:
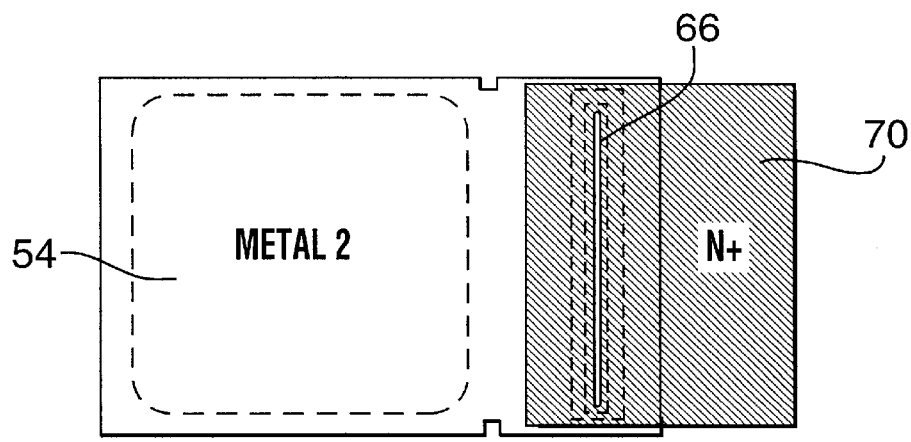
FIG. 7a is a top plan view of yet another embodiment of the present invention where a spark gap structure is shown to incorporate a metal to N+ arrangement.
Figure 7B:
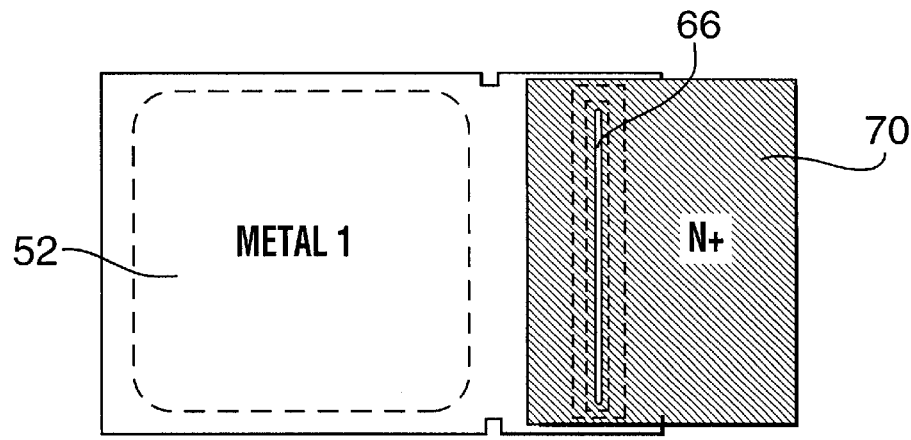
FIG. 7b is a top plan view of yet another embodiment of the present invention where a spark gap structure is shown to incorporate a different metal to N+ arrangement.
Figure 7C:
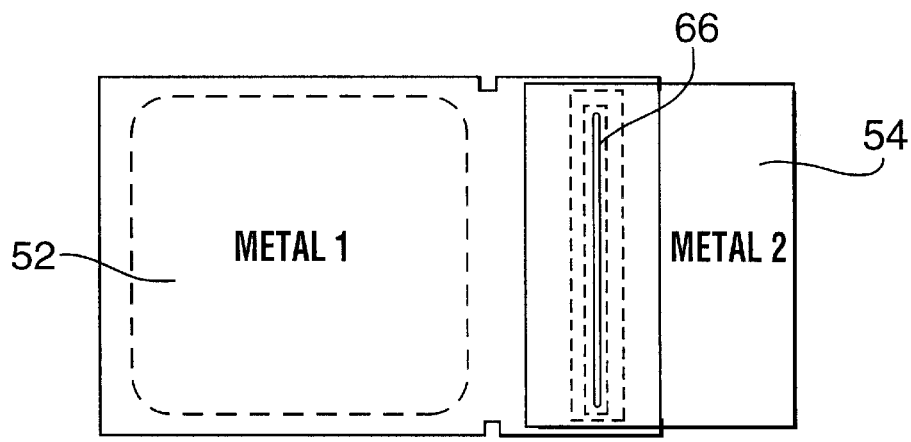
FIG. 7c is a top plan view of the arrangement includes two conductive metals.
Figure 7D:
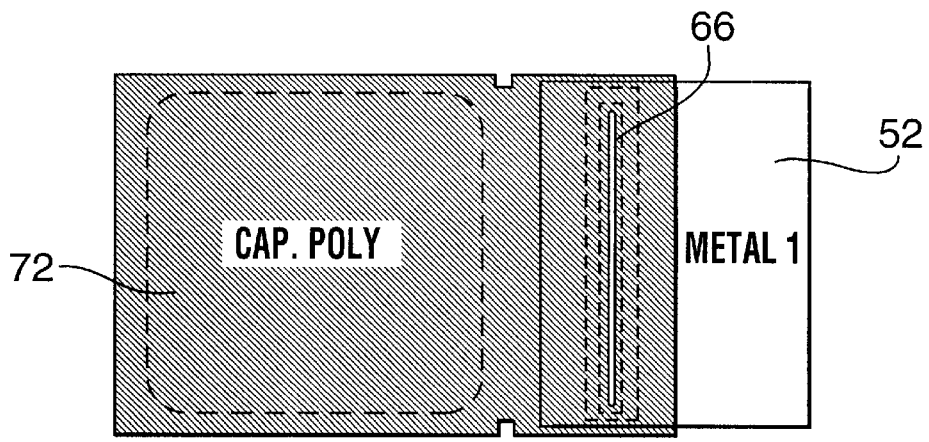
FIG. 7d is the arrangement includes a metal to a poly.
Figure 7E:
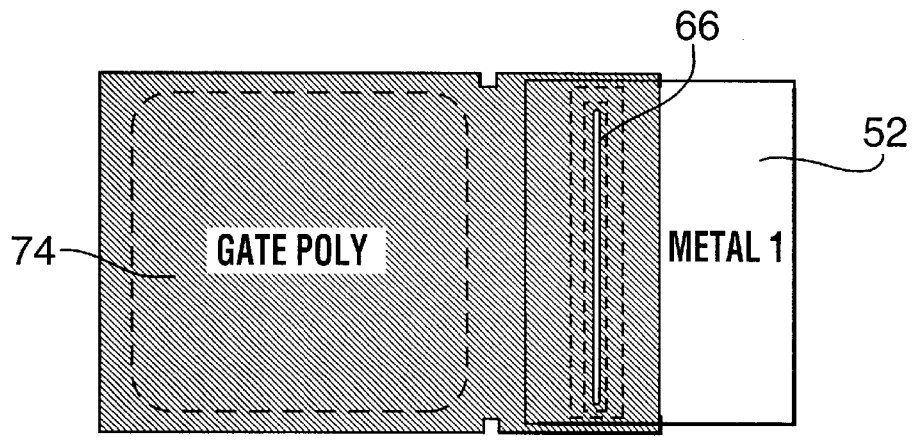
FIG. 7e is the arrangement includes a metal to gate poly.
Figure 7F:
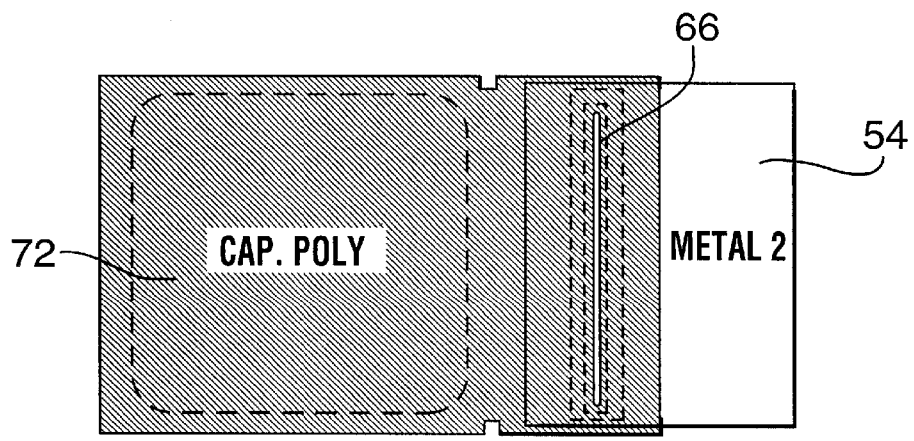
FIG. 7f is a further metal to poly.
Figure 7G:
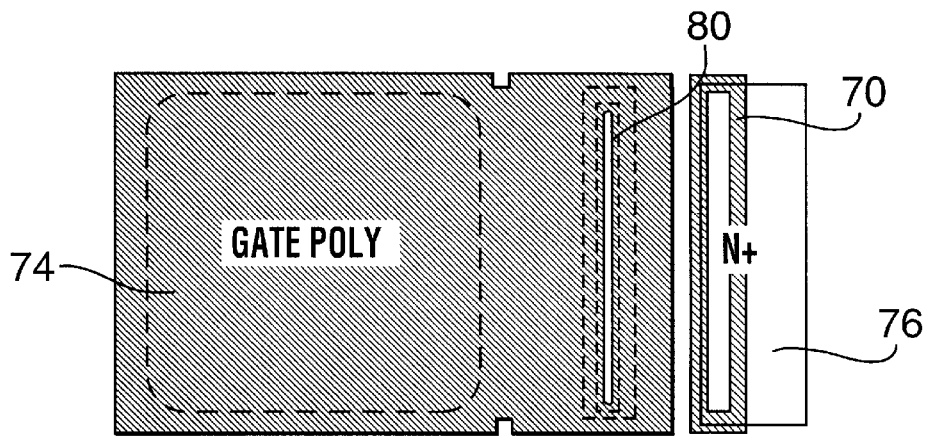
FIG. 7g is a gate poly to N-substrate.
Figure 7H:
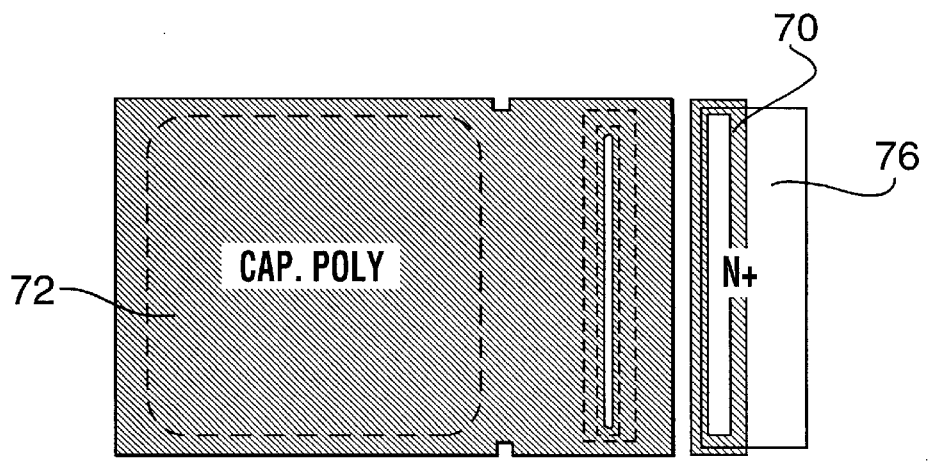
FIG. 7h is a poly to an N-substrate.
Figure 7I:
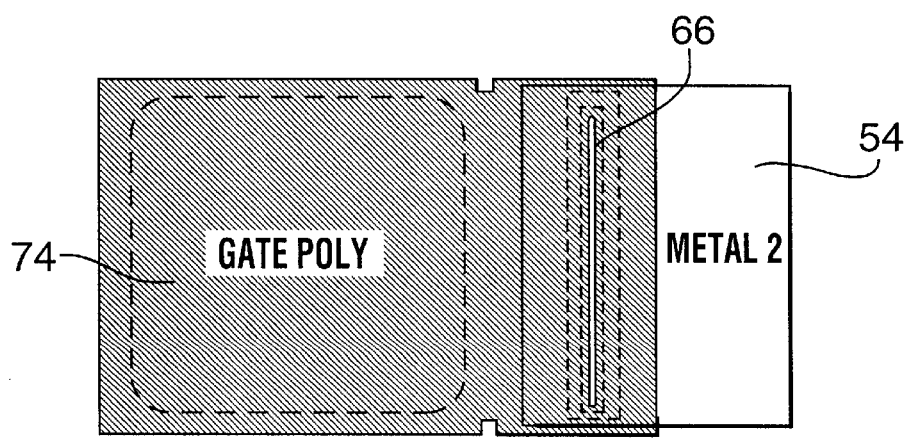
FIG. 7i is a metal to a gate poly.
Figure 7J:
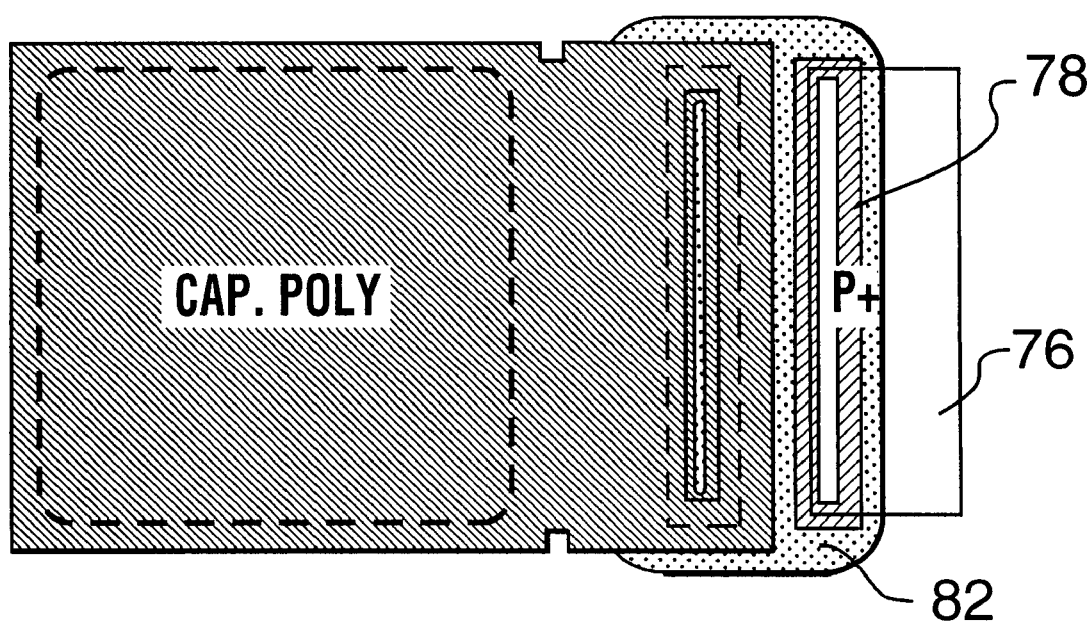
FIG. 7j is poly to a P-Well.

Many implementations are possible and the one selected will depend upon the application intended with the primary factor being the vertical spark gap dimension. In, for example, high voltage discharge applications in a plastic package, reference will be made to FIGS. 6a and 6b. In the embodiment shown, the arrangement includes a poly silicon layer 58 having a narrow slot 60 graved through it to the underlying oxide, generally denoted by numeral 62 and comprising the second conductive layer in this example. The arrangement is exposed to etchant to remove insulation material 64 between the slot 60 of membrane 58 and layer 62 to thus form the spark gap 66. In an electrostatic discharge, an electric field is developed between the periphery of the slot 60 and the lower plate 64. Avalanche or dielectric breakdown of the gas in the spark gap 66 will occur (depending upon the spark gap dimension) leading to a low electric discharge between plates 58 and 62. The breakdown voltage is made lower than the damage threshold of the component to be protected (not shown), no damage to the circuit will result. Either or both of the plates 58, 62 can be designed to limit the energy dissipated in the spark gap region 66.

It has been found that a vertical spark gap can be constructed between any two conductive or semi-conductive layers on an integrated circuit. The availability of conductive layers and the spacings will vary from process to process. FIGS. 7a through 7j show alternative examples for the use of double metal, double poly silicon integrated circuit processes. In the embodiments of 7a through 7j, the conductive layer is represented by numeral 52, conductive layer 2 is represented by numeral 54, the spark gap by numeral 66, the N+ active represented by numeral 70, the cap poly silicon by numeral 72, the gate poly silicon by numeral 74, the contact points by numeral 76, the P+ active by numeral 78, the N-Well by numeral 80, and the P-Well by numeral 82.

Suitable materials which can be employed for the spark gap assembly according to the present invention can include the refractory metals and single crystal silicon, poly silicon and high melting point alloys.

An important feature in this invention is that by making the slot in the top conductor small enough, plastic material can be excluded from the gap thereby allowing application to integrated circuits packaged in plastic.

A second extremely important feature is that these devices can be made with very low parasitic capacitance thereby allowing applications to the radio frequency market where input protection has, to date, not been feasible.

Applications are also possible in micro mechanical devices where junction diodes are, typically, not present.

The invention can be applied to any variation of an integrated circuit as set forth herein previously and is particularly well suited for materials that are most suited for high voltage applications such as silicon carbide and diamond, both of which have large band gaps and high thermal conductivities.

In view of the fact that extremely short spark gaps are possible according to the present invention, the electrostatic discharge will be due to gas dielectric breakdown within the gap rather than by avalanche breakdown. Accordingly, this will extend the breakdown voltage to the range of values previously realized by making use of junction diodes. The energy dissipated in these low voltage discharges will be low enough to permit a very small spark gap device to be used.

Although embodiments of the invention have been described above, it is not limited thereto and it will be apparent to those skilled in the art that numerous modifications form part of the present invention insofar as they do not depart from the spirit, nature and scope of the claimed and described invention.

I claim:

1. A spark gap assembly for use in integrated circuits, comprising:

a first layer composed of conductive or semiconductive material;

a second layer composed of material of said first layer;

nonconductive material positioned between said first layer and said second layer maintaining a vertically spaced relationship therebetween;

at least one opening dimensioned not greater than 1 $\mu$m in at least one of said first layer and said second layer, said nonconductive material removed from said layer having said at least one opening, whereby a vertical gap is formed between and communicates with each said layer.

2. The spark gap assembly as set forth in claim 1, wherein said first layer comprises a material similar to said second layer.

3. The spark gap assembly as set forth in claim 1, wherein said first layer comprises a material different to said second layer.

4. The spark gap assembly as set forth in claim 1, wherein each said layer comprises a plurality of conductive members in spaced and overlying relation.

5. The spark gap assembly as set forth in claim 4, wherein said conductive members are selected from conductive metals, semiconductive metals, refractory metals, and combinations thereof.

6. The spark gap assembly as set forth in claim 4, wherein at least one of said conductive members contains silicon.

7. The spark gap assembly as set forth in claim 6, wherein at least one of said conductive members contains silicon carbide.

8. An integrated circuit spark gap assembly, comprising:
   a first layer composed of conductive or semiconductive material;
   a second layer composed of material of said first layer;
   nonconductive material positioned between said first layer and said second layer maintaining a vertically spaced relationship therebetween, each layer in an overlying relationship with said material; and,
   at least one opening dimensioned not greater than 1 μm in at least one of said first layer and said second layer, said nonconductive material removed from said layer having said at least one opening, said opening comprising a vertical spark gap for dissipating electrostatic charge.

9. The spark gap assembly as set forth in claim 8, wherein each said layer comprises a plurality of conductive members in spaced and overlying relation.

10. The spark gap assembly as set forth in claim 8, wherein said conductive members materials are selected from conductive metals, semiconductive metals, refractory metals, and combinations thereof.

11. The spark gap assembly as set forth in claim 8, wherein at least one of said conductive members contains silicon.

12. A method of forming a vertical spark gap for use in dissipating electrostatic buildup in an integrated circuit, comprising:
   providing a first layer composed of conductive or semiconductive material and a second layer composed of material of said first layer;
   positioning nonconductive material between said first layer and said second layer maintaining a vertically spaced relationship therebetween; and
   forming at least one opening dimensioned not greater than 1 μm in one of said first or said second layer be etching insulating material associated with said first layer and said second layer to form a vertical gap therebetween.

\* \* \* \* \*